(12) United States Patent
Remple et al.

(10) Patent No.: US 10,727,838 B2
(45) Date of Patent: Jul. 28, 2020

(54) SYSTEMS AND METHODS FOR POWER CONSERVATION IN A PHASE LOCKED LOOP (PLL)

(71) Applicant: QUALCOMM Incorporated, San Diego, CA (US)

(72) Inventors: Terrence Brian Remple, San Diego, CA (US); Ilker Deligoz, Chandler, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/035,024

(22) Filed: Jul. 13, 2018

(65) Prior Publication Data

US 2020/0021295 A1 Jan. 16, 2020

(51) Int. Cl.
| | | |
|---|---|---|
| *H03L 7/07* | (2006.01) | |
| *G06F 1/10* | (2006.01) | |
| *H03L 7/08* | (2006.01) | |
| *H03L 7/099* | (2006.01) | |

(52) U.S. Cl.
CPC .................. *H03L 7/07* (2013.01); *G06F 1/10* (2013.01); *H03L 7/0802* (2013.01); *H03L 7/099* (2013.01)

(58) Field of Classification Search
CPC ..................... H03L 7/08–148; H03L 7/16–235
See application file for complete search history.

(56) References Cited

U.S. PATENT DOCUMENTS

| | | | | |
|---|---|---|---|---|
| 4,847,876 A | * | 7/1989 | Baumbach | ............ H04L 7/0083 375/364 |
| 5,335,365 A | * | 8/1994 | Ballantyne | .............. H03L 7/146 331/14 |
| 5,428,317 A | * | 6/1995 | Sanchez | ............... H03K 3/0315 331/1 A |
| 5,594,735 A | * | 1/1997 | Jokura | ...................... H03L 7/10 370/337 |
| 6,522,183 B2 | * | 2/2003 | Sumi | ...................... H03L 7/087 327/150 |

(Continued)

FOREIGN PATENT DOCUMENTS

WO    2015047280 A1    4/2015

OTHER PUBLICATIONS

International Search Report and Written Opinion for International Patent Application No. PCT/US2019/032664, dated Nov. 5, 2019, 19 pages.

*Primary Examiner* — Thomas J. Hiltunen
(74) *Attorney, Agent, or Firm* — W&T

(57) ABSTRACT

Power conservation in a phase locked loop (PLL) places the PLL into a low-power mode and periodically reactivates the PLL to prevent leakage current from causing a voltage controlled oscillator (VCO) within the PLL to drift. The PLL also includes an adjustable delay circuit positioned between an output of the VCO and an input of a phase detector, where the delay circuit is used to adjust phase slew of a feedback signal to help the PLL settle into a desired frequency. By controlling the drift of the VCO and keeping the phase slew of the feedback signal to a minimum, the PLL may be activated and settle to a desired frequency within a relatively short amount of time. By keeping this time so short, the PLL may be placed into and pulled out of a low-power mode and still meet rigid timing requirements of various transmission protocols.

32 Claims, 9 Drawing Sheets

(56) References Cited

U.S. PATENT DOCUMENTS

| | | | | |
|---|---|---|---|---|
| 7,023,945 B2* | 4/2006 | Wong | ............... | H03L 7/0891 327/148 |
| 7,031,675 B2* | 4/2006 | Kokubo | ............ | H04B 1/04 331/14 |
| 7,062,229 B2* | 6/2006 | Dunworth | .......... | H03L 5/00 455/260 |
| 7,102,403 B2* | 9/2006 | Wang | ............ | H03L 7/07 327/158 |
| 7,368,961 B2* | 5/2008 | Werner | ............ | G06F 1/04 327/156 |
| 7,742,554 B2* | 6/2010 | Huang | ............. | H03L 7/087 375/376 |
| 7,786,810 B2* | 8/2010 | Liu | ............... | H03L 7/0891 331/17 |
| 7,859,345 B2* | 12/2010 | Kawamoto | ........ | H03L 7/0893 331/1 A |
| 7,885,369 B2* | 2/2011 | Beyer | ............... | H03L 7/1976 327/153 |
| 8,384,450 B2* | 2/2013 | Kuramochi | ........ | H03C 3/0925 327/147 |
| 8,391,105 B2* | 3/2013 | Raymond | .......... | G04G 7/005 368/156 |
| 8,862,926 B2 | 10/2014 | De Cesare et al. | | |
| 8,976,919 B2* | 3/2015 | Hwang | ............ | H04L 7/0331 375/354 |
| 9,134,752 B2* | 9/2015 | Yasuda | .............. | G06F 1/04 |
| 9,628,094 B2 | 4/2017 | Lotfy et al. | | |
| 9,647,609 B2* | 5/2017 | Lee | ............... | H03B 5/1215 |
| 9,760,515 B2 | 9/2017 | Winemiller et al. | | |
| 9,792,247 B2 | 10/2017 | Thurston et al. | | |
| 10,141,921 B2* | 11/2018 | Chen | ............ | H03K 5/145 |
| 2002/0005763 A1 | 1/2002 | Aoki | | |
| 2006/0067453 A1* | 3/2006 | Duelk | ............. | H03L 7/0812 375/376 |
| 2008/0157879 A1* | 7/2008 | Petrov | ............ | H03L 7/0893 331/16 |
| 2011/0051639 A1 | 3/2011 | Ramakrishnan et al. | | |
| 2018/0234098 A1* | 8/2018 | Masuda | ........... | H03L 7/081 |
| 2019/0036536 A1* | 1/2019 | Siriburanon | ...... | H03L 7/091 |

* cited by examiner

SYSTEMS AND METHODS FOR POWER CONSERVATION IN A PHASE LOCKED LOOP (PLL)

BACKGROUND

I. Field of the Disclosure

The technology of the disclosure relates generally to phase locked loops (PLLs) and methods for conserving power in the use of such PLLs.

II. Background

Communication circuits have evolved from cumbersome wire-based systems that could only transmit simple codes to sophisticated wireless systems that support high-bandwidth multimedia communication. Early wireless systems relied on a super-heterodyne receiver. Such super-heterodyne receivers included several tuned circuits, which increased the complexity of the device. As early as 1932, British researchers looking for an alternative to the structure of the super-heterodyne receiver created a direct-conversion or homodyne receiver. The homodyne receiver used a local oscillator to tune to a desired input frequency and provide an output which was multiplied with the input signal to provide the original modulation information. It was rapidly discovered that the local oscillator would drift in frequency, and thus, an automatic correction signal was applied to the oscillator, maintaining it in the same phase and frequency of the desired signal. This automatic correction signal was generated by a circuit known as a phase locked loop (PLL). Applications for PLLs have proliferated and can be found in communication circuits for a variety of functions such as frequency mixing, modulation, demodulation, synchronization, frequency synthesis, signal recovery, and the like.

The simplest PLL circuits are a phase comparator, a loop filter, and a voltage controlled oscillator (VCO) that provides a feedback signal to the phase comparator. The phase comparator compares the feedback signal to the input signal and generates a control signal for the VCO. As with many feedback systems, it takes time for the control signal to adjust the VCO to the point where the output of the VCO is in phase with the input signal. This time may sometimes be referred to as the time required to settle and lock.

Since their introduction as monolithic integrated circuits (ICs), PLLs have been incorporated into ICs that include other functions such as radio frequency (RF) receivers. While early ICs were primarily used in environments that assured a ready supply of power, the advent of mobile computing devices, and their associated reliance on a battery for power, has created pressure to minimize power consumption by ICs. This desire for reduced power consumption has generated what is sometimes known as the "race to sleep" where individual ICs or portions of ICs are placed into low-power or sleep modes. PLLs consume relatively large power budgets and thus appear ripe for low-power modes. However, in many cases, a PLL is used in a transceiver and may be required to respond to incoming and outgoing signals relatively quickly. Such response times may be dictated by an external communication protocol and are frequently faster than the time required for a PLL to settle and lock. For example, in a transceiver used in a Universal Serial Bus (USB) physical layer (PHY), such response may need to be faster than four nanoseconds (4 ns) to comply with the USB protocol, compared to the multiple microseconds that are usually required to settle and lock. Given the time disparity, it is impossible for the PLL to exit a low-power mode and respond to the signal sufficiently fast to meet the USB protocol requirements. Thus, in many instances, PLLs have not been suitable targets for sleep or low-power operation. Nevertheless, pressure to extend battery operation continues to mount, and there remains a need for PLLs that consume less power.

SUMMARY OF THE DISCLOSURE

Aspects disclosed in the detailed description include systems and methods for power conservation in a phase locked loop (PLL). In an exemplary aspect, a PLL may be placed into a low-power mode and periodically reactivated to prevent leakage current from causing a voltage controlled oscillator (VCO) within the PLL to drift in frequency. In a second exemplary aspect, the PLL may include compensation for the leakage current from a phase/frequency detector (PFD), a filter, and a VCO, such that the frequency drift of the VCO is minimized when the PLL is not active. In a third exemplary aspect, the PLL includes an adjustable delay circuit positioned between an output of the VCO and an input of the PFD, where the delay circuit is used to adjust a phase of a feedback signal such that when the PLL loop is closed, the feedback signal is already at the correct phase. In this aspect, the PLL loop may be closed within three input periods of enabling the VCO. By controlling the drift of the VCO and setting the phase of the feedback signal to the locked phase, the VCO output can be available within two output cycles of an enable signal, and the PLL loop can be closed within three input cycles of the enable signal. By keeping the VCO enable time short, the PLL may be placed into and pulled out of a low-power mode and still meet rigid timing requirements of various transmission protocols. The freedom to enter such low-power modes enables power savings without compromising performance.

In this regard in one aspect, a method of operating a PLL is disclosed. The method includes placing the PLL into a low-power mode. The method also includes waking the PLL before receipt of a packet to allow an oscillator within the PLL to settle to correct drift.

In another aspect, a method of operating a PLL is disclosed. The method includes placing the PLL into an idle mode where the PLL is in a low-power mode. The method also includes activating the PLL to generate an output clock signal, such that an oscillator within the PLL is available with a desired phase and frequency within two output cycles.

In another aspect, a method of operating a PLL is disclosed. The method includes providing a time correction adjustment to a feedback signal between an output of an oscillator and an input of a phase detector. The method also includes using the phase detector to detect a difference between the feedback signal and a reference signal to generate a control signal for the oscillator.

In another aspect, a PLL is disclosed. The PLL includes a phase detector. The phase detector includes a reference clock input, a feedback signal input, and a control signal input. The PLL also includes an oscillator communicatively coupled to the control signal output and including a clock output. The PLL also includes a variable delay line circuit positioned between the clock output and the feedback signal input.

In another aspect, a method of operating a PLL is disclosed. The method includes placing the PLL into a low-power mode. The method also includes waking the PLL after receipt of a packet. The method also includes preventing phase and frequency slew during the packet.

In another aspect, a method of operating a PLL is disclosed. The method includes adjusting current between a filter and a VCO to compensate for leakage current of a phase detector, the filter, and the VCO.

DETAILED DESCRIPTION

Figure 1:
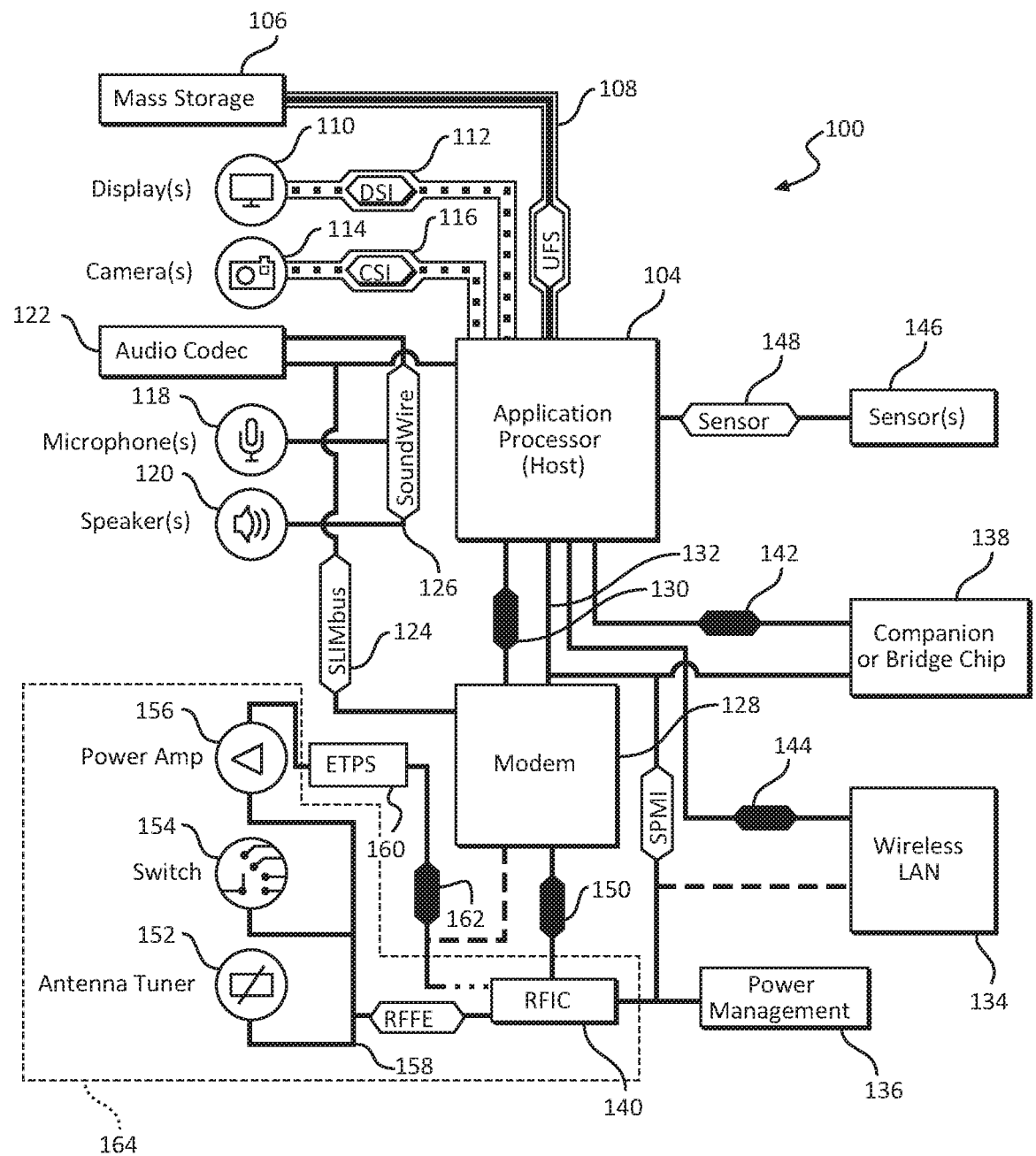
FIG. 1 is a block diagram of an exemplary mobile terminal having a variety of integrated circuits (ICs) that may include one or more phase locked loops (PLLs)

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include systems and methods for power conservation in a phase locked loop (PLL). In an exemplary aspect, a PLL may be placed into a low-power mode and periodically reactivated to prevent leakage current from causing a voltage controlled oscillator (VCO) within the PLL to drift in frequency. In a second exemplary aspect, the PLL may include compensation for the leakage current from a phase/frequency detector (PFD), a filter, and a VCO, such that the frequency drift of the VCO is minimized when the PLL is not active. In a third exemplary aspect, the PLL includes an adjustable delay circuit positioned between an output of the VCO and an input of the PFD, where the delay circuit is used to adjust a phase of a feedback signal such that when the PLL loop is closed, the feedback signal is already at the correct phase. In this aspect, the PLL loop may be closed within three input periods of enabling the VCO. By controlling the drift of the VCO and setting the phase of the feedback signal to the locked phase, the VCO output can be available within two output cycles of an enable signal, and the PLL loop can be closed within three input cycles of the enable signal. By keeping the VCO enable time short, the PLL may be placed into and pulled out of a low-power mode and still meet rigid timing requirements of various transmission protocols. The freedom to enter such low-power modes enables power savings without compromising performance.

Before addressing specific aspects of the present disclosure a brief overview of where PLLs may exist in a computing device is provided with reference to FIGS. 1-4. While exemplary aspects of the present disclosure work well with PLLs that operate in bursty environments, such as in a transceiver for a Universal Serial Bus (USB) connection, the present disclosure is not so limited, and other PLLs may also benefit from the power-saving techniques described herein. A discussion of the circuitry and processes associated with exemplary aspects of the present disclosure begins below with reference to FIG. 5.

FIG. 1 is a block diagram of an exemplary processor-based system that can include one or more transceivers, each with one or more PLLs. In this regard, a computing system 100 includes an application processor 104 that communicates with a mass storage element 106 through a universal flash storage (UFS) bus 108. The application processor 104 may further be connected to a display 110 through a display serial interface (DSI) bus 112 and a camera 114 through a camera serial interface (CSI) bus 116. Various audio elements, such as a microphone 118, a speaker 120, and an audio codec 122 may be coupled to the application processor 104 through a serial low-power interchip multimedia bus (SLIMbus) 124. Additionally, the audio elements may communicate with each other through a SOUNDWIRE bus 126. A modem 128 may also be coupled to the SLIMbus 124 and/or the SOUNDWIRE bus 126. The modem 128 may further be connected to the application processor 104 through a Peripheral Component Interconnect (PCI) or PCI express (PCIE) bus 130 and/or a system power management interface (SPMI) bus 132.

With continued reference to FIG. 1, the SPMI bus 132 may also be coupled to a (wireless) local area network (LAN or WLAN) IC (LAN IC or WLAN IC) 134, a power management integrated circuit (PMIC) 136, a companion IC (sometimes referred to as a bridge chip) 138, and a radio frequency (RF) IC (RFIC) 140. It should be appreciated that separate PCI buses 142 and 144 may also couple the application processor 104 to the companion IC 138 and the WLAN IC 134. The application processor 104 may further be connected to sensors 146 through a sensor bus 148. The sensor bus 148 may be a USB bus. The modem 128 and the RFIC 140 may communicate using a bus 150.

With continued reference to FIG. 1, the RFIC 140 may couple to one or more radio frequency front end (RFFE) elements, such as an antenna tuner 152, a switch 154, and a power amplifier 156 through an RFFE, bus 158. Additionally, the RFIC 140 may couple to an envelope tracking power supply (ETPS) 160 through a bus 162, and the ETPS 160 may communicate with the power amplifier 156. Collectively, the RFFE elements, including the RFIC 140, may be considered an RFFE system 164. It should be appreciated that the RFFE bus 158 may be formed from a clock line and a data line (not illustrated).

While not illustrated in FIG. 1 (but more specifically illustrated in FIG. 3, discussed below), the application processor 104 may be coupled to one or more external peripherals, such as a memory device or audio headset through a USB bus. Such USB bus may include a USB compliant receptacle and cable or a proprietary receptacle and cable that use USB signaling. Such USB bus as well as other transceivers in the computing system 100 may include respective transceivers that include one or more PLLs which may be placed into a low-power mode for power savings according to exemplary aspects of the present disclosure.

Figure 2:
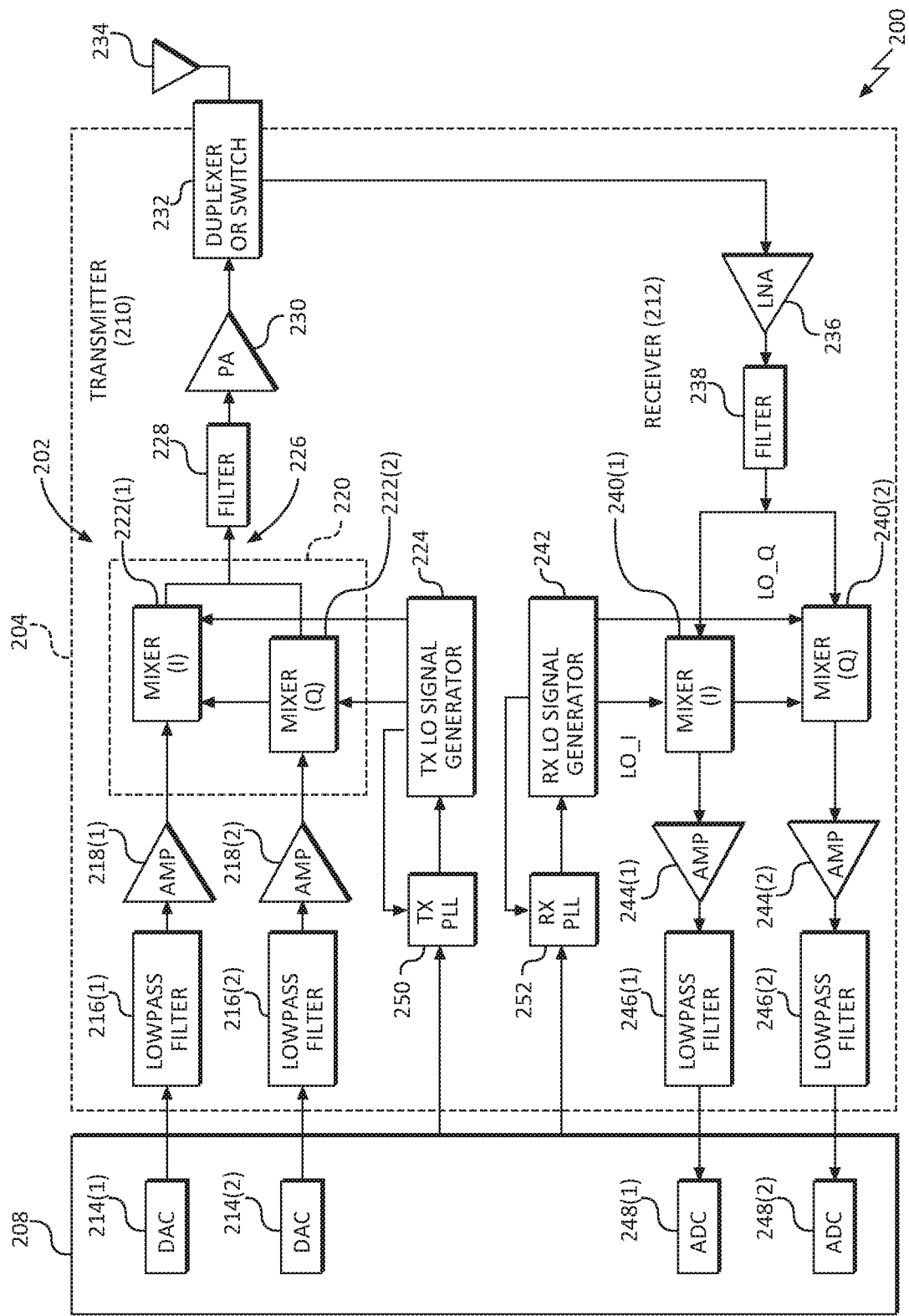
FIG. 2 is a block diagram of an exemplary transceiver that includes one or more PLLs that may be placed in a low-power mode to conserve power.

FIG. 2 illustrates an exemplary wireless communications device 200 that includes RF components formed in an IC 202, which may be the RFIC 140 of FIG. 1. The wireless communications device 200 includes a transceiver 204 and a data processor 208. The data processor 208 may include a memory to store data and program codes. The transceiver 204 includes a transmitter 210 and a receiver 212 that support bi-directional communications. In general, the wireless communications device 200 may include any number of transmitters 210 and/or receivers 212 for any number of communications systems and frequency bands. All or a portion of the transceiver 204 may be implemented on one or more analog ICs, RFICs, mixed-signal ICs, etc.

The transmitter 210 or the receiver 212 may be implemented with a super-heterodyne architecture or a direct-conversion (homodyne) architecture. In the super-heterodyne architecture, a signal is frequency-converted between RF and baseband in multiple stages, e.g., from RF to an intermediate frequency (IF) in one stage, and then from IF to baseband in another stage for the receiver 212. In the direct-conversion architecture, a signal is frequency-converted between RF and baseband in one stage. The super-heterodyne and direct-conversion architectures may use different circuit blocks and/or have different requirements. In the wireless communications device 200 of FIG. 2, the transmitter 210 and the receiver 212 are implemented with the direct-conversion architecture.

In the transmit path, the data processor 208 processes data to be transmitted and provides I and Q analog output signals to the transmitter 210. In the exemplary wireless communications device 200, the data processor 208 includes digital-to-analog converters (DACs) 214(1) and 214(2) for converting digital signals generated by the data processor 208 into the I and Q analog output signals, e.g., I and Q output currents, for further processing.

Within the transmitter 210, low-pass filters 216(1) and 216(2) filter the I and Q analog output signals, respectively, to remove undesired signals caused by the prior digital-to-analog conversion. Amplifiers (AMPs) 218(1) and 218(2) amplify the signals from the low-pass filters 216(1) and 216(2), respectively, and provide I and Q baseband signals. An upconverter 220 upconverts the I and Q baseband signals with I and Q transmit (TX) local oscillator (LO) signals through mixers 222(1) and 222(2) from a TX LO signal generator 224 to provide an upconverted signal 226. A filter 228 filters the upconverted signal 226 to remove undesired signals caused by the frequency upconversion as well as noise in a receive frequency band. A power amplifier (PA) 230 amplifies the upconverted signal 226 from the filter 228 to obtain the desired delivered power level and provides a transmit RF signal. The transmit RF signal is routed through a duplexer or switch 232 and transmitted via an antenna 234.

In the receive path, the antenna 234 receives signals transmitted by base stations and provides a received RF signal, which is routed through the duplexer or switch 232 and provided to a low noise amplifier (LNA) 236. The duplexer or switch 232 is designed to operate with a specific receive (RX)-to-TX duplexer frequency separation, such that RX signals are isolated from TX signals. The received RF signal is amplified by the LNA 236 and filtered by a filter 238 to obtain a desired RF input signal. Downconversion mixers 240(1) and 240(2) mix the output of the filter 238 with I and Q RX LO signals (i.e., LO_I and LO_Q) from an RX LO signal generator 242 to generate I and Q baseband signals. The I and Q baseband signals are amplified by AMPs 244(1) and 244(2) and further filtered by low-pass filters 246(1) and 246(2) to obtain I and Q analog input signals, which are provided to the data processor 208. In this example, the data processor 208 includes analog-to-digital converters (ADCs) 248(1) and 248(2) for converting the analog input signals into digital signals to be further processed by the data processor 208.

In the wireless communications device 200 of FIG. 2, the TX LO signal generator 224 generates the I and Q TX LO signals used for frequency upconversion, while the RX LO signal generator 242 generates the I and Q RX LO signals used for frequency downconversion. Each LO signal is a periodic signal with a particular fundamental frequency. A TX PLL circuit 250 receives timing information from the data processor 208 and generates a control signal used to adjust the frequency and/or phase of the TX LO signals from the TX LO signal generator 224. Similarly, an RX PLL circuit 252 receives timing information from the data processor 208 and generates a control signal used to adjust the frequency and/or phase of the RX LO signals from the RX LO signal generator 242.

It should be appreciated that any or all of these PLLs may benefit from exemplary aspects of the present disclosure. While such wireless transceivers and their associated PLLs may use exemplary aspects of the present disclosure, other PLLs, such as those used by transceivers coupled to external peripherals may also use exemplary aspects of the present disclosure.

Figure 3:
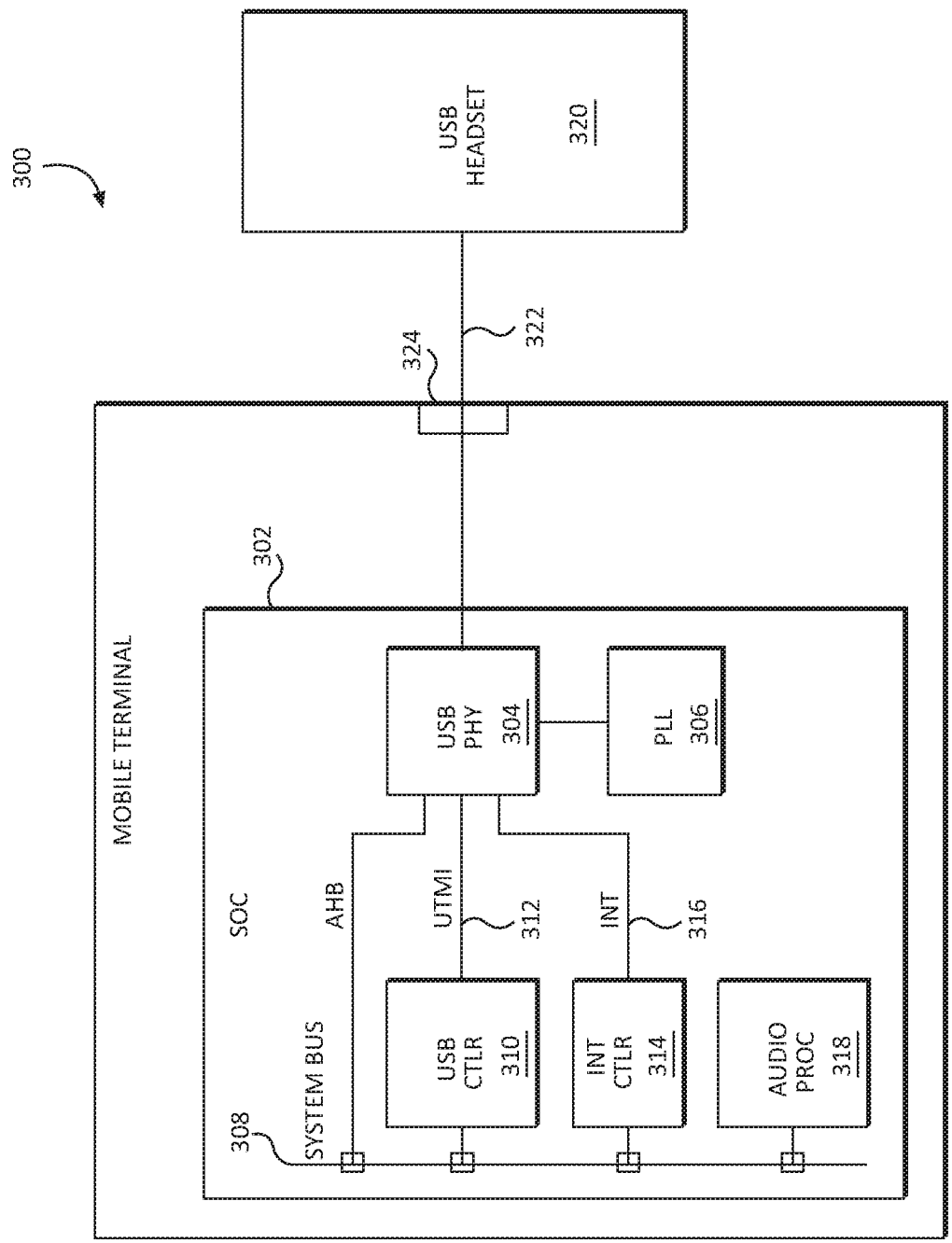
FIG. 3 is a simplified block diagram of an exemplary mobile terminal coupled to a headset peripheral through a Universal Serial Bus (USB) connection where a USB transceiver within a system on a chip (SOC) has a PLL that may be placed in a low-power mode to conserve power.

FIG. 3 illustrates a simplified computing device 300, which may be a mobile terminal that includes a system on a chip (SOC) 302 having a USB physical layer (PHY) 304 that includes a transceiver (not illustrated) and is coupled to a PLL 306. The USB PHY 304 receives data from a system bus 308, which may be an advanced high-speed bus (AHB). Likewise, the USB PHY 304 may communicate with a USB controller 310 through a USB 2.0 Transceiver Macrocell Interface (UTMI) bus 312 and with an interrupt controller 314 through an interrupt bus 316. The data for the USB PHY 304 may be placed on the system bus 308 by an audio processor 318. The computing device 300 may communicate with an external peripheral such as a USB audio headset 320 through a USB compliant cable 322 plugged into a receptacle 324 that is configured to carry USB compliant signals. In an exemplary aspect, the receptacle 324 may be a USB Type-C compliant receptacle. In an alternate exemplary aspect, the receptacle 324 may be a proprietary receptacle that carries USB compliant signals (e.g., LIGHTNING, THUNDERBOLT, or the like).

The PLL 306 may be placed into a low-power mode according to exemplary aspects of the present disclosure. Data coming in from the receptacle 324 and coming from the system bus 308 may be processed by waking the PLL 306 according to exemplary aspects of the present disclosure and, in particular, the PLL 306 can be woken and settle within two clock periods so as to comply with the USB protocol transmission requirements (i.e., transmit over the cable 322 within four nanoseconds (4 ns) after receipt from the system bus 308).

Figure 4:
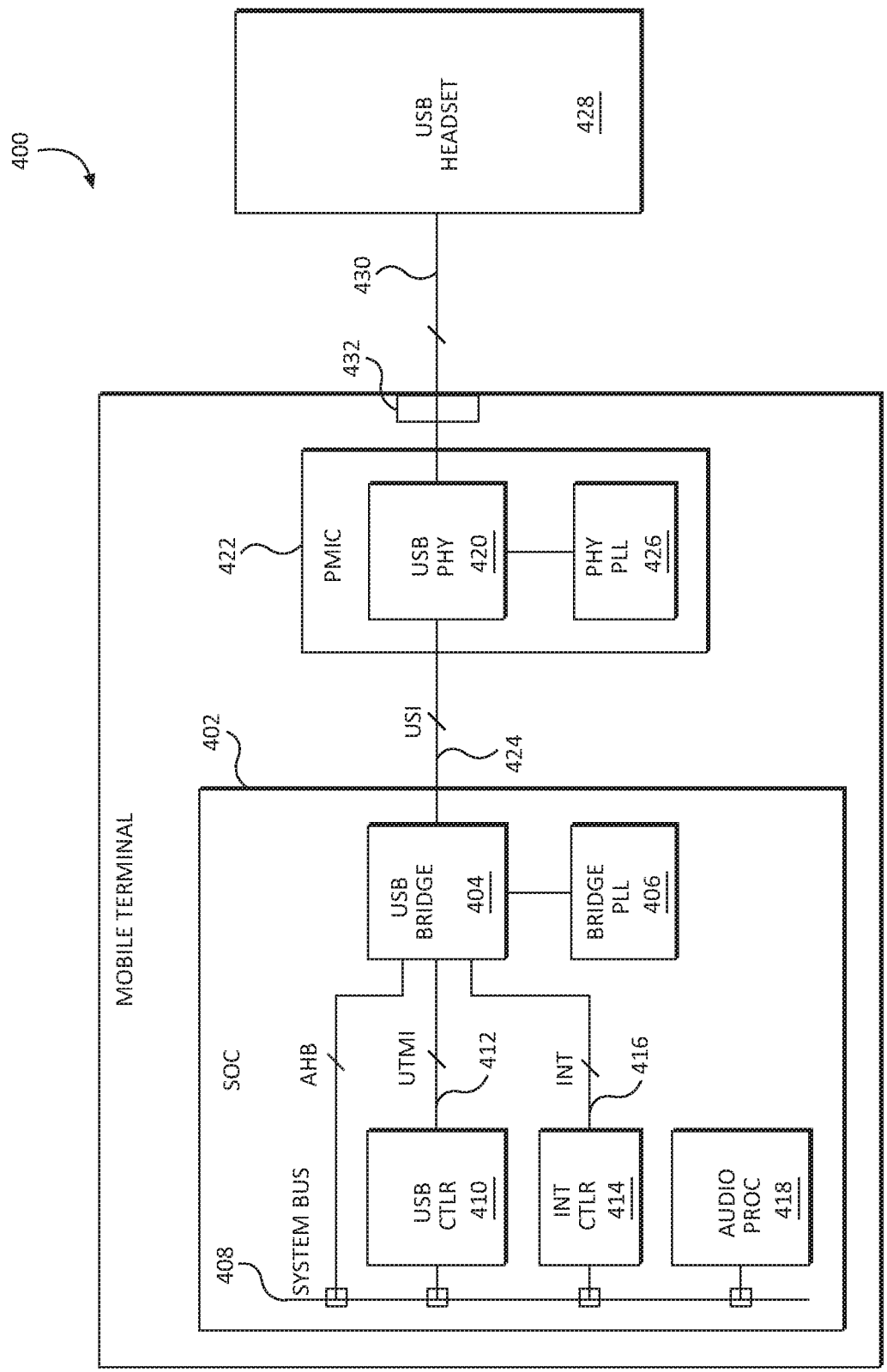
FIG. 4 is a simplified block diagram of an alternate exemplary mobile terminal coupled to a headset peripheral through a USB connection where a USB transceiver within a power management IC (PMIC) has a PLL that may be placed in a low-power mode to conserve power.

FIG. 4 illustrates a simplified computing device 400 that has moved the USB PHY out of the SOC. In particular, the computing device 400 may be a mobile terminal that includes a SOC 402 having a USB bridge 404 that includes a transceiver (not illustrated) and is coupled to a bridge PLL 406. The USB bridge 404 receives data from a system bus 408, which may be an AHB. Likewise, the USB bridge 404 may communicate with a USB controller 410 through a UTMI bus 412 and with an interrupt controller 414 through an interrupt bus 416. The data for the USB bridge 404 may be placed on the system bus 408 by an audio processor 418.

With continued reference to FIG. 4, the USB bridge 404 may communicate with a USB PHY 420 within a PMIC 422 over a universal serial interface (USI) bus 424. The USB PHY 420 may use a PHY PLL 426 which may be placed into a low-power mode of operation according to exemplary aspects of the present disclosure.

The computing device 400 may communicate with an external peripheral such as a USB audio headset 428 through a USB compliant cable 430 plugged into a receptacle 432 that is configured to carry USB compliant signals. In an exemplary aspect, the receptacle 432 may be a USB Type-C compliant receptacle. In an alternate exemplary aspect, the receptacle 432 may be a proprietary receptacle that carries USB compliant signals (e.g., LIGHTNING, THUNDERBOLT, or the like).

Exemplary aspects of the present disclosure contemplate putting PLLs, such as the PHY PLL 426, into a low-power mode when there is no data to be transmitted or received. For example, USB allows 480 megabits per second (Mb/s) of data to be transmitted, but a typical USB audio stream is only around 12 Mb/s, meaning that only approximately 3% of the time is used for audio transmission. The remaining 97% is ripe for low-power operation. Continuing the USB example, USB requires that the PHY clock (which depends on the PLL) needs to be running within four nanoseconds (4 ns) of an incoming packet. Conventional techniques to wake a PLL generally require multiple microseconds before the PLL settles and locks. Exemplary aspects of the present disclosure shorten the time to settle and lock to approximately 2 ns. To avoid the long delays of conventional approaches, exemplary aspects of the present disclosure adopt a three-part approach to achieve this quick settling process. While the greatest benefit is achieved through use of all three parts, it should be appreciated that faster PLL activation may be achieved by using only one or two of these parts and the present disclosure does not require all parts be used to realize benefits described herein. The first part of the three-part approach checks to see that the VCO is activated with a certain frequency. The activation may be a function of data traffic or a pre-emptive waking of the VCO. This first part allows voltage drift of the frequency of the VCO to be minimized and/or corrected such that the VCO will have an appropriate output frequency at activation. The second part of the three-part approach compensates for leakage current from the PFD, the filter, and the VCO such that the frequency drift of the VCO is minimized when the PLL is not active. The third part of the three-part approach minimizes phase slew at the PFD by adding a variable delay line between the VCO and the PFD to add a time correction adjustment to the feedback signal such that the feedback signal is already at the correct phase when the feedback signal initially arrives at the PFD.

Figure 5:
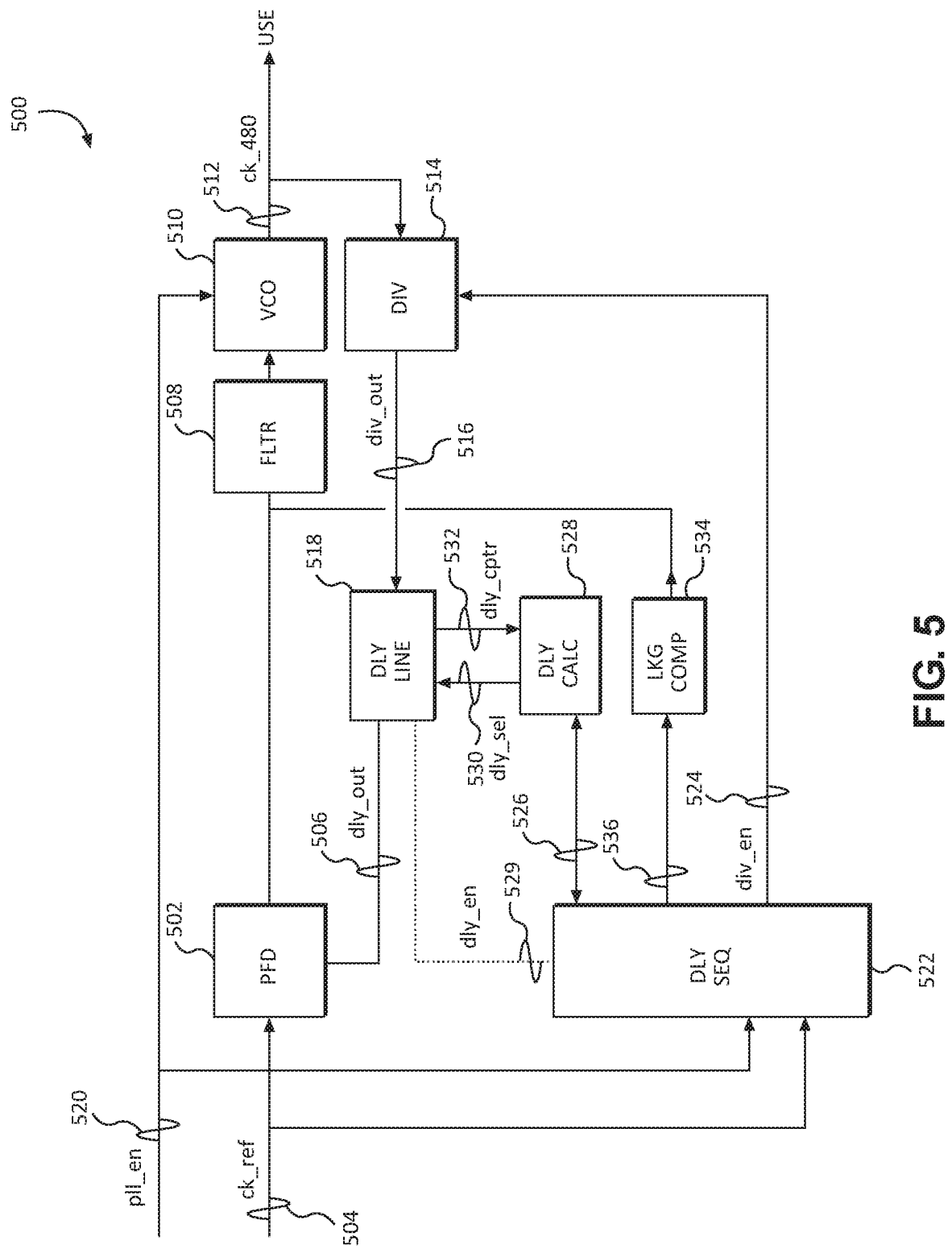
FIG. 5 is a simplified block diagram of a PLL having a variable delay line circuit to control phase slew according to an exemplary aspect of the present disclosure.

Before explaining the processes used by exemplary aspects of the present disclosure, a discussion of the PLL is appropriate. In this regard, FIGS. 5-8 illustrate a PLL and interior elements modified to enable aspects of the present disclosure. FIG. 5 illustrates PLL 500, which may be the PHY PLL 426 or another PLL in the computing system 100, the wireless communications device 200, the computing device 300, or the computing device 400. The PLL 500 includes a PFD 502 that receives an input clock signal 504 (ck_ref) and a delayed feedback signal 506 (dly_out). The PFD 502 outputs a signal (not labeled) to a filter 508 (FLTR), which filters the signal and provides the filtered signal to a VCO 510. The VCO 510 provides an output signal 512 (ck_480), which is split and used by some other element (USE) and also forms the preliminary basis of the delayed feedback signal 506. Specifically, the output signal 512 is provided to a divider 514 (DIV), which divides the output signal 512 to form a divided output signal 516 (div_out). The divided output signal 516 is provided to a variable delay line circuit 518 (DLY LINE). The variable delay line circuit 518 generates the delayed feedback signal 506. As is readily apparent, the variable delay line circuit 518 is positioned between the VCO 510 and the PFD 502, and more specifically is between the divider 514 and the PFD 502.

With continued reference to FIG. 5, the VCO 510 is enabled by a PLL enable signal 520 (pll_en), which is also provided to a delay sequencer 522 (DLY SEQ). The delay sequencer 522 also receives the input clock signal 504. From these inputs, the delay sequencer 522 generates a divider enable signal 524 (div_en) for the divider 514, a control signal 526 for a delay calculator 528 (DLY CALL), and a delay enable signal 529 (dly_en) for the variable delay line circuit 518. The control signal 526 may include a delay clock start (dly_strt_ck) and a delay clock end (dly_end_ck) signal embedded therein. The delay calculator 528 sends a control signal 530 (dly_sel) to the variable delay line circuit 518 and receives a signal 532 (dly_cptr) from the variable delay line circuit 518. As noted above, the variable delay line circuit 518 is set such that when the PLL loop is closed shortly after the VCO 510 is enabled, the PLL 500 is already at its locked phase. More details on this process are provided below with reference to FIGS. 8A and 8B.

With continued reference to FIG. 5, a leakage compensation circuit 534 (LKG COMP) provides a small current to the output of the PFD 502, which zeroes out any leakage current that is introduced from the PFD 502, the filter 508 and/or an input of the VCO 510. Shortly after the PLL enable signal 520 is asserted, the delay sequencer 522 checks if the VCO frequency has drifted up or down while the PLL 500 was disabled. The delay sequencer 522 then adjusts the leakage compensation circuit 534 using signal 536 to create an output such that the frequency drift is minimized.

Figure 6:
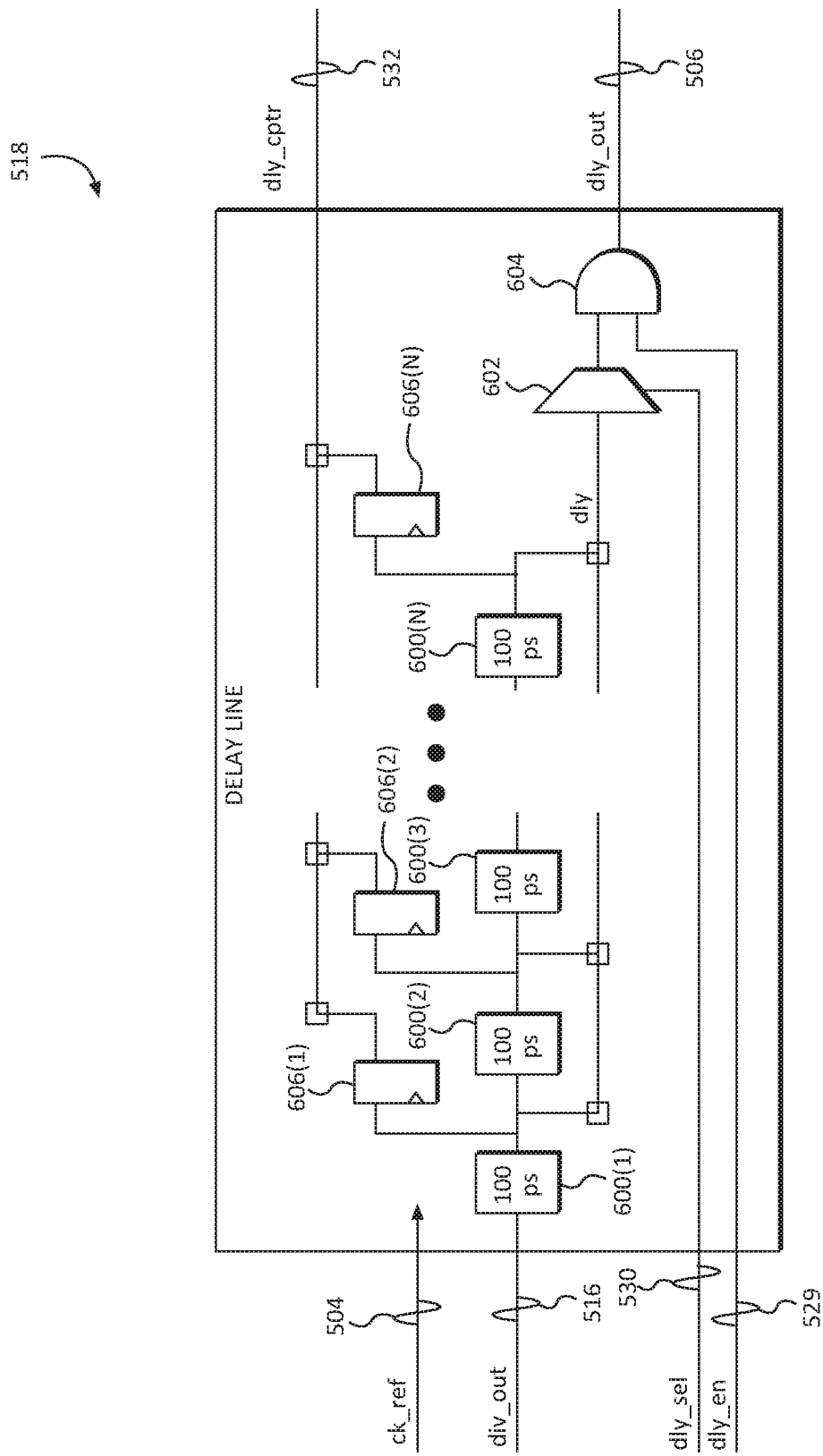
FIG. 6 is a simplified block diagram of the variable delay line circuit used in the PLL of FIG. 5.

FIG. 6 provides a more detailed view of the variable delay line circuit 518 of FIG. 5. In particular, the divided output signal 516 is provided to a series of delay elements 600(1)-600(N) (generically delay element 600). In an exemplary aspect, each delay element 600 is 100 picoseconds and N is 32. Outputs of each of the delay elements 600(1)-600(N) are provided to a multiplexer 602, which is controlled by the control signal 530 to output a delayed signal to an AND gate 604. The AND gate 604 also receives the delay enable signal 529 and outputs the delayed feedback signal 506 when enabled. The variable delay line circuit 518 further outputs the signal 532, which is captured from the delay elements 600(1)-600(N) through flops 606(1)-606(N). The flops 606 (1)-606(N) are clocked by a rising edge of the input clock signal 504 at the beginning of a burst, which captures the initial delay between the input clock signal 504 and the divided output signal 516. This initial delay is compared to the delay at the end of the burst as selected by the multiplexer 602, and this correction is stored for the next burst. This value can be stored in a register in the delay sequencer 522 or the delay calculator 528. While FIG. 6 illustrates the variable delay line circuit 518 as having delay elements 600, it should be appreciated that such elements could be buffers, lines having variable physical lengths such that there are different propagation delays therethrough, or other physical elements to create different delays.

Figure 7:
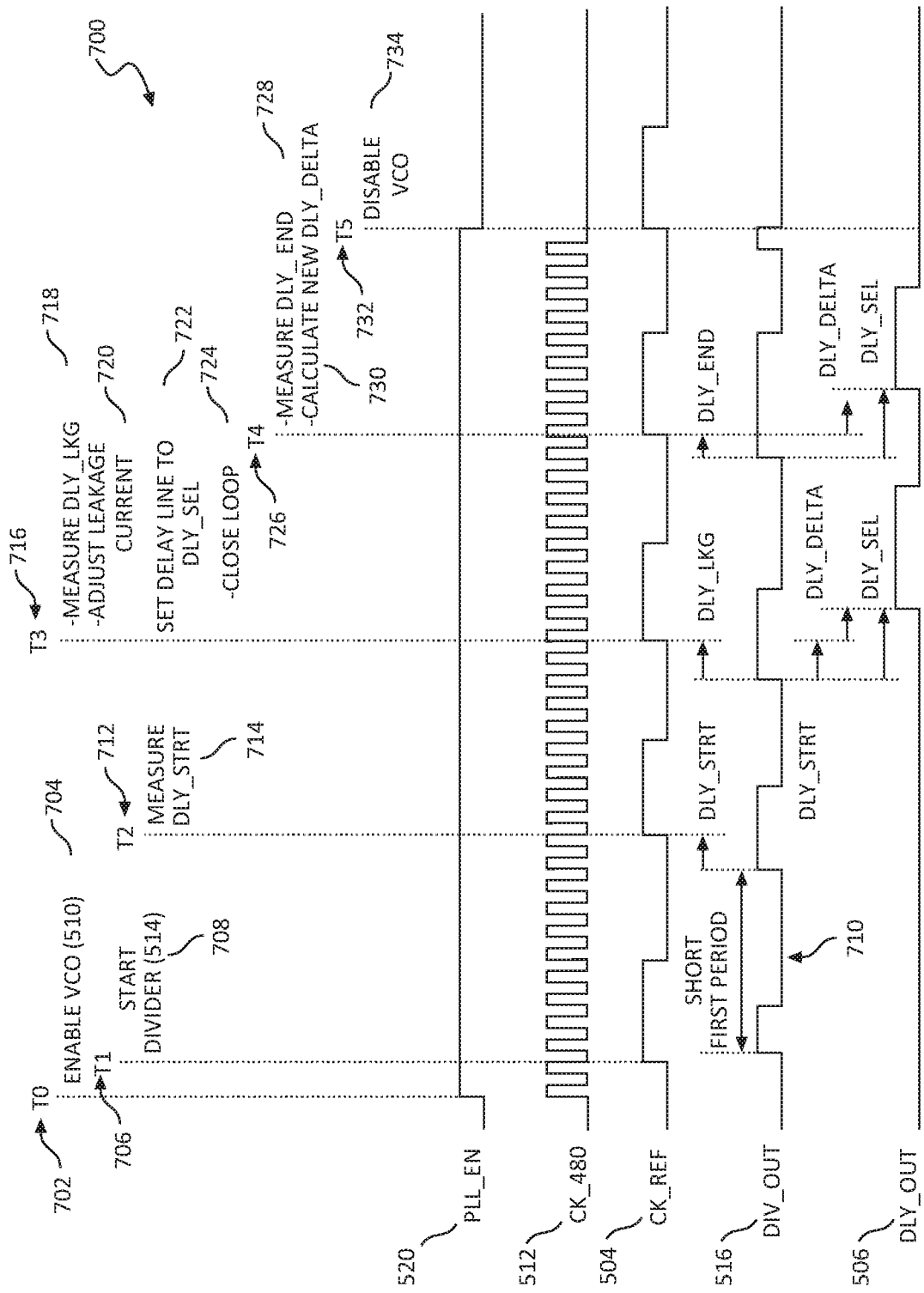
FIG. 7 is a simplified timing diagram showing operation of the PLL of FIG. 5.

FIG. 7 is a timing diagram 700 that shows the operation of the PLL 500 of FIG. 5. As illustrated at time T0 (702), the PLL enable signal 520 is asserted, and the VCO 510 output is turned on immediately (block 704). The PLL loop is not closed at this point, so the VCO 510 is free running Δt time T1 (706), on the first rising edge of the input clock signal 504, the divider 514 is enabled (block 708). However, the divider 514 is enabled such that its first period is shorter than its nominal period. This forces the divider 514 output to go high before the second rising edge of the input clock signal 504 (generally at 710). At time T2 (712), on the second rising edge of the input clock signal 504, the delay between the divided output signal 516 and the input clock signal 504 is measured (dly_strt) (block 714). At time T3 (716), on the third rising edge of the input clock signal 504, the delay between the divided output signal 516 and the input clock signal 504 is again measured (dly_lkg) (block 718). If dly_lkg is less than dly_strt, the VCO frequency drifted up during idle, and the leakage compensation circuit 534 output current is decreased. If dly_lkg is greater than dly_strt, the VCO frequency drifted down during idle, and the leakage compensation circuit 534 output current is increased (block 720). Also at time T3, the dly_delta from the previous burst is added to dly_strt to set the delay of the variable delay line circuit 518 (block 722). The loop is then closed by allowing the PFD 502 to start comparing the delayed feedback signal 506 with the input clock signal 504 (block 724). Since delay between the delayed feedback signal 506 and the input clock signal 504 is already at the correct value, the PLL 500 is already locked. The phase and frequency of the PLL 500 output should remain constant for the duration of the burst. At time T4 (726), just before the end of a burst, the delay between the divided output signal 516 and the input clock signal 504 is again measured (dly_end) (block 728). By this time, the PLL 500 has adjusted the delay between the delayed feedback signal 506 and the input clock signal 504, such that the phase is truly locked. A new value of dly_delta is calculated (dly_delta=dly_sel−dly_end), which is then used for the next burst (block 730). At time T5 (732), the PLL enable signal 520 is de-asserted (block 734).

Figure 8A:
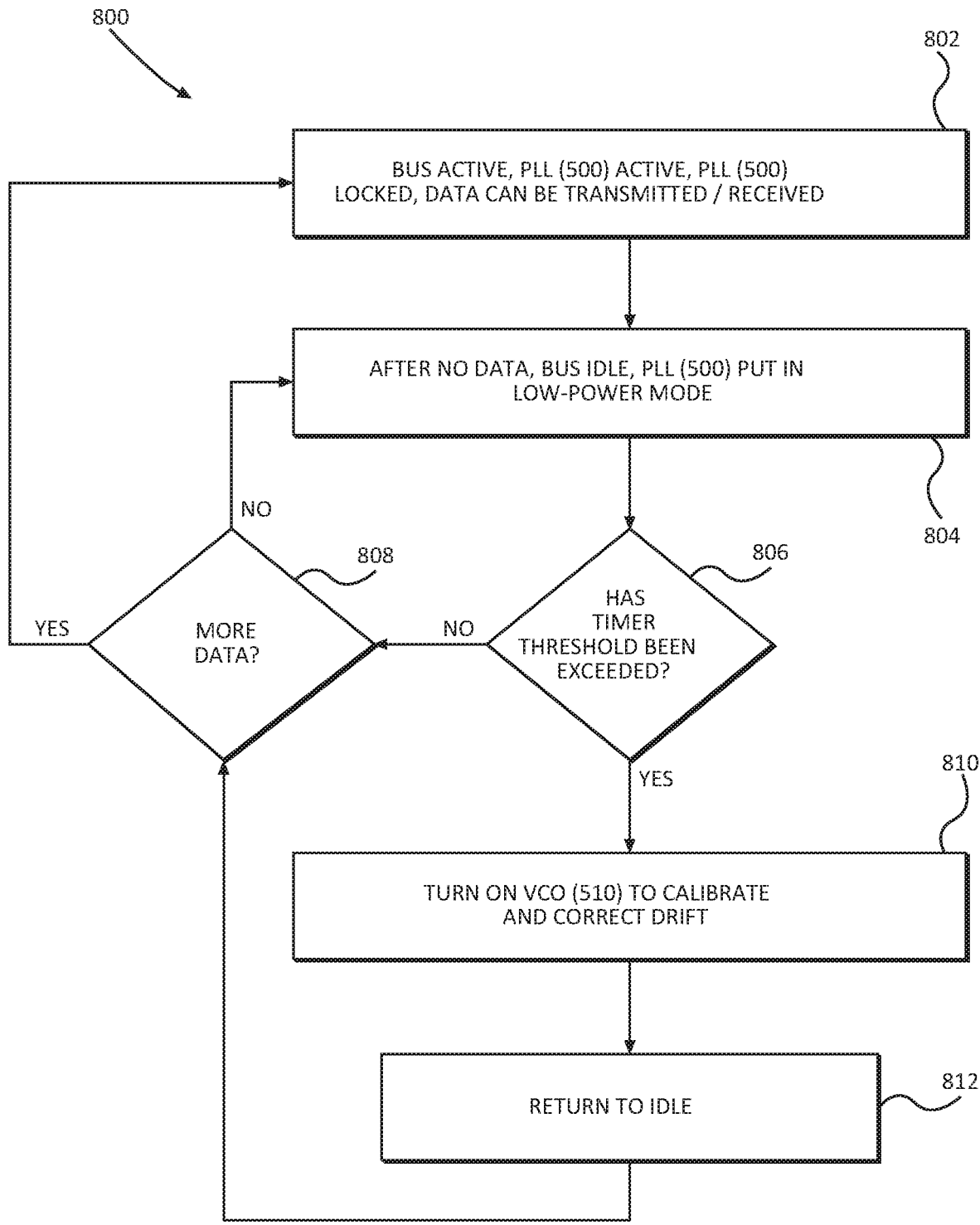
FIG. 8A is a flowchart illustrating an exemplary process for turning on and off a voltage controlled oscillator (VCO) of a PLL to avoid frequency drift by the VCO while in a low-power mode.

Against that backdrop of hardware, the processes used to enable power savings by turning off the PLL 500 of FIG. 5 are described herein with reference to FIG. 8A. The timing diagram illustrated in FIG. 8B assists in the explanation. In particular, FIG. 8A illustrates a process 800 to correct for drift in the VCO 510. That is, when the VCO 510 is turned off while the PLL 500 is in a low-power mode, there may be some leakage current from the PFD 502 which causes the output frequency of the VCO 510 to drift. Thus, the process 800 provides a way to correct for the drift. In this regard, the process 800 starts with the bus active and the PLL 500 active, where the PLL 500 is locked on a desired frequency and data may be transmitted and received (block 802). This corresponds to transmit field 850 in FIG. 8B. After data has been transmitted or received and no further data is received, the bus may be idle and the PLL 500 may be put into a low-power mode (block 804). This corresponds to section 852 of FIG. 8B. The process 800 checks to see if a timer threshold has been exceeded (block 806). In an exemplary aspect, where the bus is a USB bus, the timer threshold may be four microseconds (4 µs). If the answer is no, the timer threshold has not been exceeded, the process 800 checks to see if more data has arrived to be processed (block 808). If the answer is yes, such as the additional receive data in section 854 of FIG. 8B, then the bus reactivates, the timer may be reset, the PLL 500 is active, and the data is processed (i.e., return to block 802). Another idle period (section 856 of FIG. 8B) is incurred as the process 800 steps through block 804 again, returning to the determination of whether the timer threshold has been exceeded (block 806). If no data is subsequently received at block 808, then eventually block 806 is answered affirmatively (i.e., no data has been received for a period of time equal to or exceeding the timer threshold). Once block 806 is answered affirmatively, the process 800 turns on the VCO 510 and allows the VCO 510 to settle and lock onto the desired frequency. This calibrates the VCO 510 and corrects any drift that may have occurred since the VCO 510 was last active (block 810). This corresponds to section 858 in FIG. 8B. The process 800 then allows the PLL 500 to return to idle (block 812) (section 860 of FIG. 8B) and then return to block 808 to check for data and restart the timer.

Figure 8B:
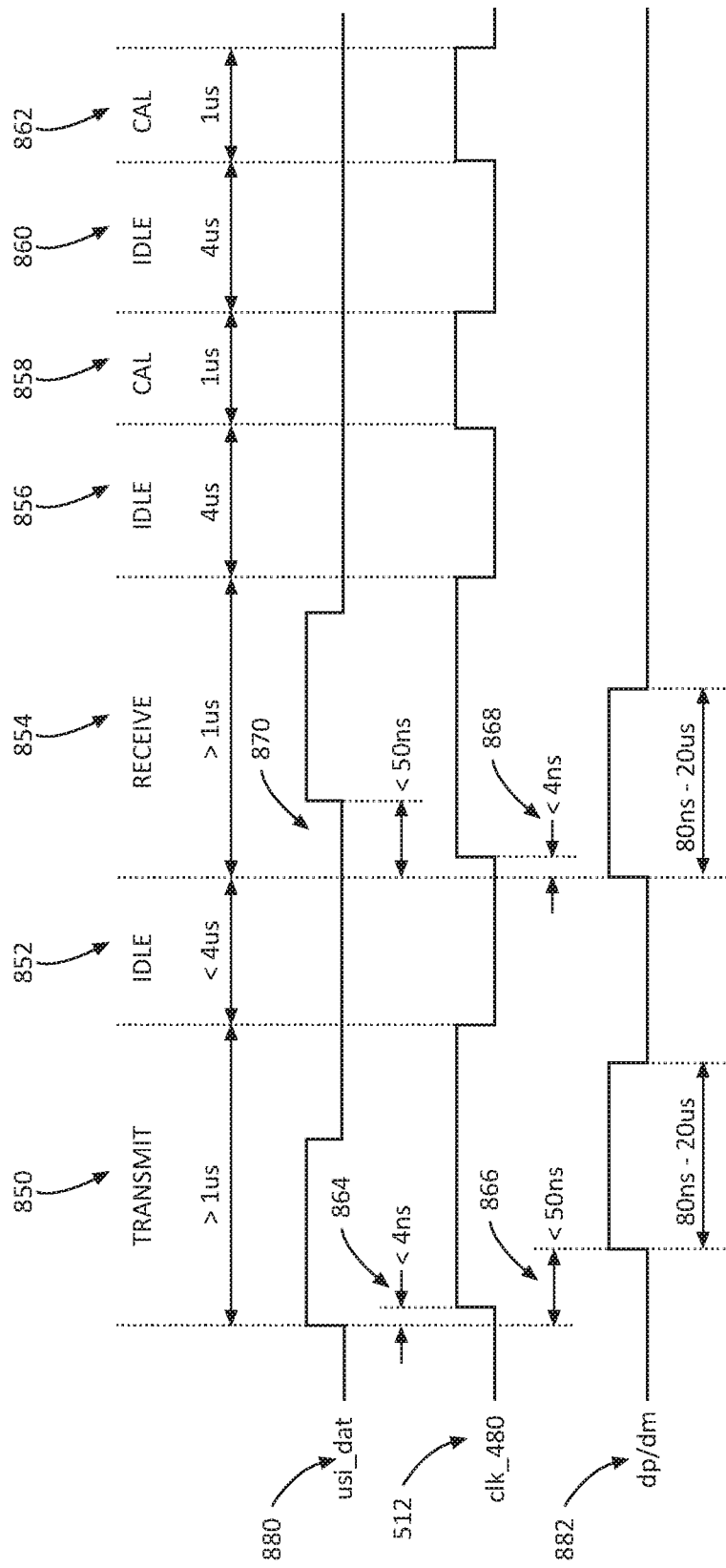
FIG. 8B is a timing diagram showing toggling of the VCO according to the process of FIG. 8A.

Turning now to FIG. 8B, signal 880 on a USI bus (sometimes referred to as usi_dat), the output signal 512, and signal 882 on a USB bus (sometimes referred to as D+/D−, dplus/dminus, or dp/dm) are illustrated. The signal 880 is active when there is data being transmitted or received (e.g., sections 850 and 854). The output signal 512 is active when there is data being transmitted and received as well as during calibration sections 858 and 862 corresponding to when the VCO 510 is active. The signal 882 is the traffic on the USB bus, which occurs when data is being transmitted or received (sections 850 and 854). Assuming a USB protocol, the VCO 510 is active within 4 ns of receipt of data on the signal 880 (shown generally at 864) and that data is placed on the USB bus within 50 ns (shown generally at 866) and data is transmitted. Similarly, when data is received on the bus, the VCO 510 is active within 4 ns (shown generally at 868) and the data is placed on the USI bus within 50 ns (shown generally at 870).

Note that while the above discussion assumes that the activation of the VCO 510 occurs periodically, the present disclosure is not so limited. In an alternate aspect, the VCO 510 may be activated randomly during idle times according to a random number generator or according to some repeating series (e.g., even numbers less than a threshold, prime numbers less than the threshold, Fibonacci numbers less than the threshold, etc.). Further, the threshold may be set according to a predicted drift or may be reprogrammed according to detected drift. For example, if, after a few hours of operation, it is observed that the rate of drift is less than one Hertz per minute (1 Hz/min), then the threshold may be set at one minute. Conversely, if the drift is observed to be tens of Hz/µs, then the threshold may be set in the low microsecond range. Still other ways of setting or implementing the threshold may be used without departing from the scope of the present disclosure.

The systems and methods for power conservation in a PLL according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A method of operating a phase locked loop (PLL), comprising:
   placing the PLL into a low-power mode;
   waking the PLL before receipt of a packet to allow an oscillator within the PLL to settle to correct for drift, wherein waking the PLL before the receipt of the packet comprises starting a timer; and
   returning to the low-power mode after the oscillator settles and drift correction is made but before the receipt of the packet.

2. The method of claim 1, further comprising resetting the timer when the packet is received before expiration of the timer.

3. The method of claim 1, further comprising using the PLL to provide a clock signal for a Universal Serial Bus (USB) physical layer (PHY).

4. The method of claim 1, wherein the timer has a threshold that is derived empirically from observed drift.

5. The method of claim 1, wherein the timer is programmable.

6. The method of claim 1, wherein placing the PLL into the low-power mode comprises placing the PLL into the low-power mode when an associated bus is idle.

7. The method of claim 1, wherein the oscillator comprises a voltage controlled oscillator (VCO).

8. The method of claim 1, further comprising:
   placing the PLL into an idle mode where the PLL is in the low-power mode; and
   activating the PLL to generate an output clock signal, such that the oscillator within the PLL is available with a desired phase and frequency within two output cycles.

9. The method of claim 8, further comprising correcting the drift of the oscillator prior to activating the PLL.

10. The method of claim 9, wherein correcting the drift comprises activating the oscillator during the idle mode.

11. The method of claim 10, wherein activating the oscillator comprises periodically activating the oscillator.

12. The method of claim 8, further comprising compensating for phase slew.

13. The method of claim 12, wherein compensating for the phase slew comprises applying a historical lock delay to a divided signal.

14. The method of claim 13, further comprising comparing a new delay to the historical lock delay.

15. The method of claim 8, wherein activating the PLL comprises activating the PLL independently of a reference clock signal.

16. The method of claim 1, further comprising:
waking the PLL after the receipt of the packet; and
preventing phase and frequency slew during the packet.

17. The method of claim 16, further comprising locking the PLL within two output cycles.

18. The method of claim 1, further comprising:
adjusting current between a filter and a phase detector to compensate for leakage current of the phase detector, the filter, and a voltage controlled oscillator (VCO).

19. The method of claim 18, further comprising enabling the VCO.

20. The method of claim 19, wherein enabling the VCO comprises enabling the VCO in a locked frequency condition as a function of the adjusting.

21. A method of operating a phase locked loop (PLL), comprising:
placing the PLL into a low-power mode;
waking the PLL before receipt of a packet to allow an oscillator within the PLL to settle to correct for drift;
returning to the low-power mode after the oscillator settles and drift correction is made but before the receipt of the packet;
providing a time correction adjustment to a feedback signal between an output of the oscillator and an input of a phase detector; and
using the phase detector to detect a difference between the feedback signal and a reference signal to generate a control signal for the oscillator.

22. The method of claim 21, wherein providing the time correction adjustment comprises using a variable delay line circuit to provide the time correction adjustment.

23. The method of claim 22, wherein using the variable delay line circuit comprises initially using a historical lock delay value to adjust the feedback signal.

24. The method of claim 23, further comprising calculating a new delay value and storing the new delay value.

25. A phase locked loop (PLL) comprising:
a phase detector comprising:
a reference clock input;
a feedback signal input; and
a control signal output;
an oscillator communicatively coupled to the control signal output and comprising a clock output wherein the oscillator is configured to wake and re-enter a low-power mode before receipt of a packet and settle to correct for drift; and
a variable delay line circuit positioned between the clock output and the feedback signal input.

26. The PLL of claim 25, wherein the oscillator comprises a voltage controlled oscillator (VCO).

27. The PLL of claim 25, further comprising a filter positioned between the control signal output and the oscillator.

28. The PLL of claim 25, further comprising a divider coupled to the clock output and the variable delay line circuit.

29. The PLL of claim 25, wherein the variable delay line circuit comprises a plurality of delay elements.

30. The PLL of claim 25, further comprising a delay calculator coupled to the variable delay line circuit and configured to control an amount of delay imposed on a feedback signal from the oscillator.

31. The PLL of claim 25 integrated into an integrated circuit (IC).

32. The PLL of claim 25 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

* * * * *